(12) United States Patent
Sasselli

(10) Patent No.: US 11,361,838 B2
(45) Date of Patent: Jun. 14, 2022

(54) CYCLIC REDUNDANCY CHECK CIRCUIT, CORRESPONDING DEVICE AND METHOD

(71) Applicant: STMICROELECTRONICS S.r.l., Agrate Brianza (IT)

(72) Inventor: Luca Sasselli, Milan (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 112 days.

(21) Appl. No.: 16/870,757

(22) Filed: May 8, 2020

(65) Prior Publication Data

US 2020/0381072 A1    Dec. 3, 2020

(30) Foreign Application Priority Data

May 27, 2019  (IT) ............... 102019000007371

(51) Int. Cl.
| | | |
|---|---|---|
| *G11C 29/42* | (2006.01) | |
| *G06F 9/30* | (2018.01) | |
| *G11C 29/20* | (2006.01) | |
| *G11C 29/44* | (2006.01) | |
| *G11C 29/00* | (2006.01) | |

(52) U.S. Cl.
CPC .......... *G11C 29/42* (2013.01); *G06F 9/30029* (2013.01); *G11C 29/20* (2013.01); *G11C 29/44* (2013.01); *G11C 29/785* (2013.01)

(58) Field of Classification Search
CPC ......... G11C 29/42; G11C 29/20; G11C 29/44; G11C 29/785; H03M 13/091
USPC .................. 716/746, 747, 742, 743
See application file for complete search history.

(56) References Cited

U.S. PATENT DOCUMENTS

| | | | | |
|---|---|---|---|---|
| 6,003,151 A | * | 12/1999 | Chuang ............... | G06F 11/1008 714/48 |
| 8,443,256 B2 | | 5/2013 | Shafai et al. | |
| 8,539,326 B1 | | 9/2013 | Nethercot et al. | |
| 10,812,103 B1 | * | 10/2020 | Bairi ........................ | G06F 21/64 |
| 2002/0191616 A1 | * | 12/2002 | Sarmiento ............ | H04Q 3/0087 370/400 |
| 2002/0196794 A1 | * | 12/2002 | Bloch .................. | H04Q 3/0087 370/401 |
| 2004/0123221 A1 | * | 6/2004 | Huffman ............. | H03M 13/093 714/776 |
| 2005/0268209 A1 | * | 12/2005 | Mann ................... | H03M 13/091 714/776 |
| 2014/0281844 A1 | * | 9/2014 | Jiang ................... | H03M 13/091 714/807 |
| 2019/0379397 A1 | * | 12/2019 | Kekely ............... | H03M 13/091 |

OTHER PUBLICATIONS

Salah, "An Online Parallel CRC32 Realization for Hybrid Memory Cube Protocol," 9th International Computer Engineering Conference, Dec. 28-29, 2013, Giza, Egypt, 4 pages.

* cited by examiner

*Primary Examiner* — Shelly A Chase
(74) *Attorney, Agent, or Firm* — Seed IP Law Group LLP

(57) ABSTRACT

A device includes serial cyclic redundancy check (CRC) processing circuitry and parallel CRC processing circuitry. The serial CRS processing circuitry, in operation, generates a set of intermediate CRC bits based on a first set of seed bits and input data. The parallel CRC processing circuitry is coupled to the serial CRC processing circuitry, and, in operation, generates, using the set of intermediate CRC bits as a set of parallel seed bits and using null input bits, a set of output CRC bits corresponding to the input data.

21 Claims, 4 Drawing Sheets

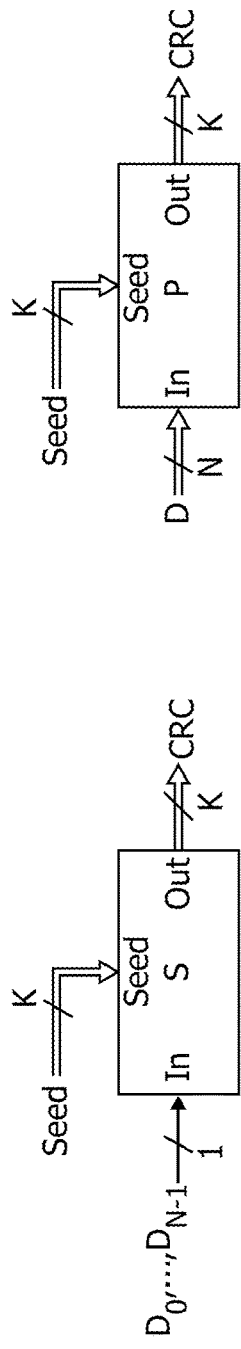
FIG. 1A
FIG. 1B
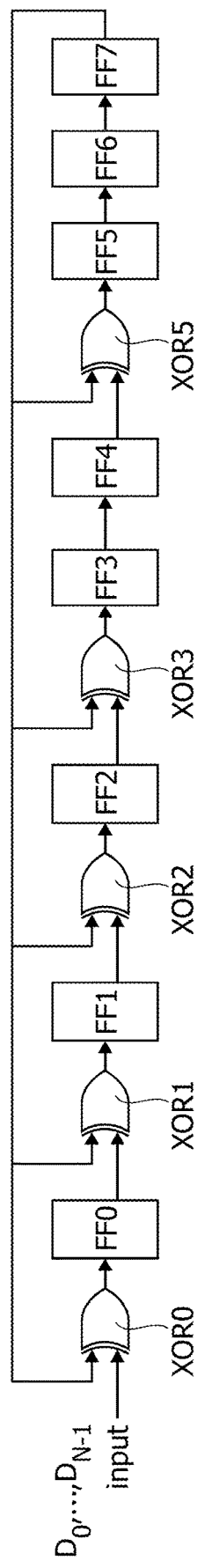
FIG. 2A
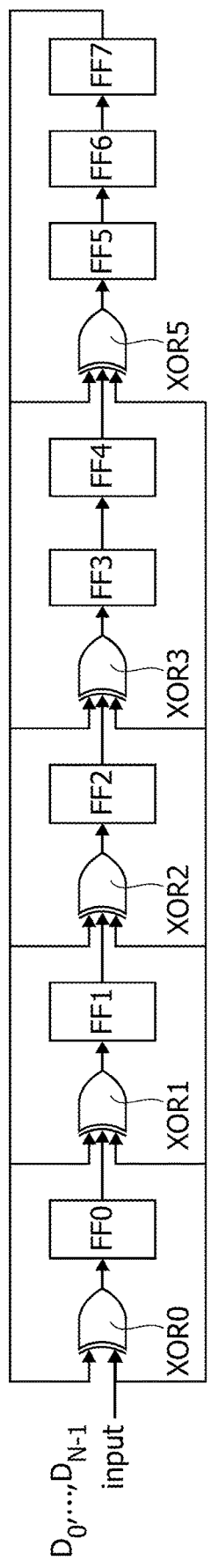
FIG. 2B

CYCLIC REDUNDANCY CHECK CIRCUIT, CORRESPONDING DEVICE AND METHOD

BACKGROUND

Technical Field

The description relates to techniques involving the computation of Cyclic Redundancy Check, briefly CRC.

One or more embodiments may be applied, for instance, to verifying integrity of data, in data transmission and storage, for instance.

Description of the Related Art

Various digital networks and storage devices adopt a Cyclic Redundancy Check, briefly CRC, as an error-detecting code in order to detect accidental changes in data.

When using CRC, blocks of data entering these systems get a short check value attached, based on the remainder of a polynomial division of their contents. A common approach applied in circuits for computing CRC involves producing CRC as the remainder of a polynomial division involving input data and a fixed divisor, referred to as the CRC polynomial. Circuits implementing CRC are extensively used in a wide variety of applications and standards.

BRIEF SUMMARY

Despite the extensive activity in that area, increased flexibility and re-usability of a CRC circuit represents desirable features.

An object of one or more embodiments is to contribute in providing correspondingly improved solutions.

One or more embodiments may relate to a corresponding device.

One or more embodiments may relate to a corresponding method, for use in SPI protocol, for instance.

The claims are an integral part of the disclosure of the disclosure as provided herein.

One or more embodiments facilitate computing a Cyclic Redundancy Check (CRC) involving computing the checksum of an N-bit dataset in N clock cycles, in the absence of seed restrictions.

One or more embodiments may provide advantages in terms of clock cycles in comparison with a serial CRC circuit (a linear-feedback shift register or LFSR, for instance) and in terms of semiconductor area in comparison with a combinational CRC circuit, thus giving rise to an improved trade-off.

One or more embodiments may facilitate applications of serial transmission protocols (SPI protocols, for instance).

One or more embodiments may involve a sort of a hybrid serial/combinational architecture involving both serial and parallel processing.

In an embodiment, a device comprises: serial cyclic redundancy check (CRC) processing circuitry, which, in operation, generates a set of intermediate CRC bits based on a first set of seed bits and input data; and parallel CRC processing circuitry coupled to the serial CRC processing circuitry, which, in operation, generates, using the set of intermediate CRC bits as a set of parallel seed bits and using null input bits, a set of output CRC bits corresponding to the input data. In an embodiment, the serial CRC processing circuitry and the parallel CRC processing circuitry, in operation, use a same CRC polynomial. In an embodiment, the serial CRC processing circuitry comprises a linear-feedback shift register, LFSR. In an embodiment, wherein the parallel CRC processing circuitry comprises a combinational CRC circuit. In an embodiment, the parallel CRC processing circuitry comprises a cascaded arrangement of combinational circuits, each of the combinational circuits including: a one-bit shift circuit having an input coupled to a data input node of the combinational circuit; and an exclusive OR (XOR) gate having a first input coupled to an output of the one-bit shift circuit, a second input which, in operation, receives a bit of a bit string encoding a CRC polynomial, and an output coupled to an output node of the combination circuit, wherein, the input node of a first combinational circuit in the cascaded arrangement of combinational circuits is coupled to the serial CRC processing circuitry, and, in operation receives the set of intermediate CRC bits; the data input nodes of the combinational circuits in the cascaded arrangement of combinational circuits other than the first combinational circuit are coupled to the output node of a preceding combinational circuit in the cascaded arrangement of combinational circuits; and the output node of a last combinational circuit in the cascaded arrangement of combinational circuits, in operation, outputs the set of output CRC bits corresponding to the input data. In an embodiment, the first set of seed bits has a size of K bits, the set of intermediate CRC bits has a size of K bits, and the set of output CRC bits has a size of K bits, where K is a positive integer greater than 1. In an embodiment, the input data has a size greater than K bits.

In an embodiment, a system comprises: data processing circuitry, which, in operation, generates input data; cyclic redundancy check (CRC) generating circuitry, including: serial CRC circuitry, which, in operation, generates a set of intermediate CRC bits based on a first set of seed bits and input data generated by the data processing circuitry; and parallel CRC circuitry coupled to the serial CRC circuitry, which, in operation, generates, using the set of intermediate CRC bits as a set of parallel seed bits and using null input bits, a set of output CRC bits corresponding to the input data generated by the data processing circuitry. In an embodiment, the system comprises output processing circuitry, which, in operation, receives the set of output CRC bits from the CRC generating circuitry. In an embodiment, the output processing circuitry receives the input data and combines the input data with the set of output CRC bits in a data packet. In an embodiment, the system comprises a memory and the output processing circuitry controls storage of the data packet in the memory. In an embodiment, the system comprises a transmitter, and the output processing circuitry controls transmission of the data packet by the transmitter in a data channel. In an embodiment, the serial CRC circuitry and the parallel CRC circuitry, in operation, use a same CRC polynomial. In an embodiment, the parallel CRC circuitry comprises a cascaded arrangement of combinational circuits, each of the combinational circuits including: a one-bit shift circuit having an input coupled to a data input node of the combinational circuit; and an exclusive OR (XOR) gate having a first input coupled to an output of the one-bit shift circuit, a second input which, in operation, receives a bit of a bit string encoding a CRC polynomial, and an output coupled to an output node of the combination circuit, wherein, the input node of a first combinational circuit in the cascaded arrangement of combinational circuits is coupled to the serial CRC circuitry, and, in operation receives the set of intermediate CRC bits; the data input nodes of the combinational circuits in the cascaded arrangement of combinational circuits other than the first combinational circuit are coupled to the output node of a preceding combinational circuit in the cascaded arrangement of combinational circuits; and the output node of a last combinational circuit in the cascaded arrangement of combinational circuits, in operation, outputs the set of output CRC bits corresponding to the input data. In an embodiment, each of the combinational circuits comprises a multiplexer having inputs coupled to the one-bit shift circuit and the XOR gate, and having an output coupled to the output node of the combinational circuit. In an embodiment, the serial CRC circuitry comprises a linear-feedback shift register, LFSR.

In an embodiment, a method comprises: generating, using serial cyclic redundancy check (CRC) circuitry, a set of intermediate CRC bits based on a first set of seed bits and input data; generating, using parallel CRC circuitry, a set of output CRC bits corresponding to the input data using the set of intermediate CRC bits as a set of parallel seed bits and using null data. In an embodiment, the method comprises generating the input data. In an embodiment, the method comprises combining the input data with the set of output CRC bits in a data packet. In an embodiment, the method comprises storing the data packet. In an embodiment, the method comprises transmitting the data packet over a data channel.

BRIEF DESCRIPTION OF THE SEVERAL VIEWS OF THE DRAWINGS

One or more embodiments will now be described, by way of example only, with reference to the annexed figures, wherein:

FIG. 1A is exemplary of a circuit implementing a serial solution to compute a CRC code, FIG. 1B is exemplary of a circuit implementing a combinational solution to compute a CRC code, FIG. 2A is a circuit diagram exemplary of a circuit implementing a serial computation of CRC, FIG. 2B is another circuit diagram exemplary of a circuit implementing a serial computation of CRC.

DETAILED DESCRIPTION

Figure 3A:
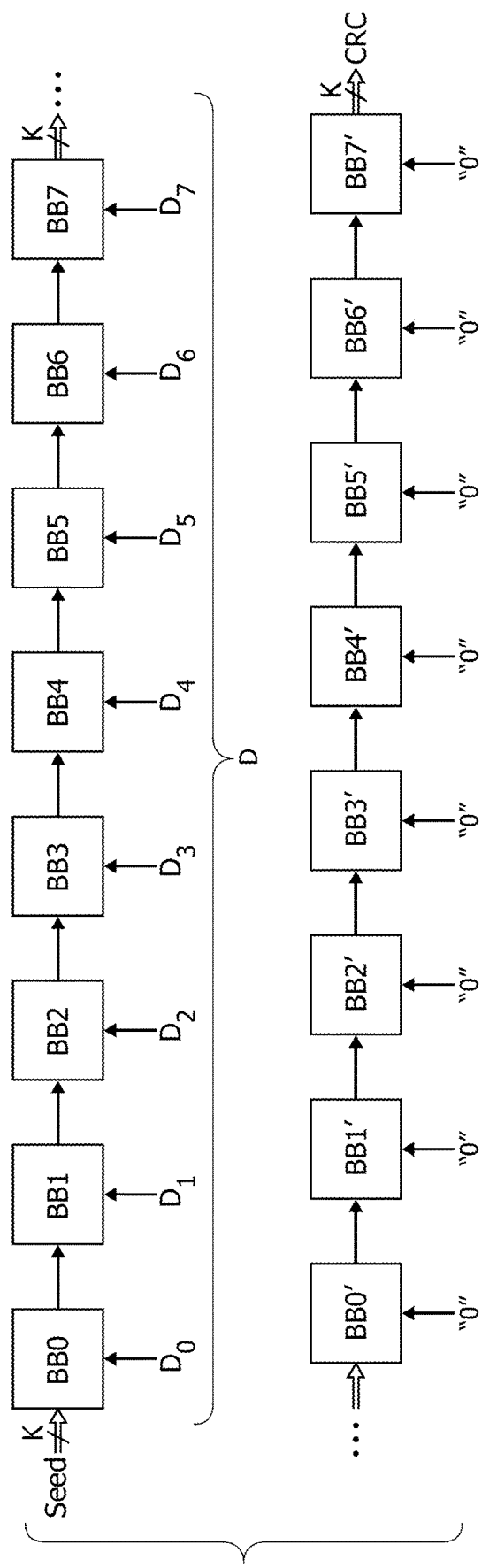
FIG. 3A is a circuit diagram exemplary of a circuit implementing a parallel (combinational) computation of CRC.

In the following description, certain details are set forth in order to provide a thorough understanding of various embodiments of devices, systems, methods and articles. However, one of skill in the art will understand that other embodiments may be practiced without these details. In other instances, well-known structures and methods associated with, for example, logic gates, flip flops and signal processing circuitry, such as transistors, multipliers, transmitters, integrated circuits, etc., have not been shown or described in detail in some figures to avoid unnecessarily obscuring descriptions of the embodiments.

Unless the context requires otherwise, throughout the specification and claims which follow, the word "comprise" and variations thereof, such as "comprising," and "comprises," are to be construed in an open, inclusive sense, that is, as "including, but not limited to."

The headings are provided for convenience only, and do not interpret the scope or meaning of this disclosure.

The sizes and relative positions of elements in the drawings are not necessarily drawn to scale. For example, the shapes of various elements and angles are not drawn to scale, and some of these elements are enlarged and positioned to improve drawing legibility. Further, the particular shapes of the elements as drawn are not necessarily intended to convey any information regarding the actual shape of particular elements, and have been selected solely for ease of recognition in the drawings.

In the ensuing description one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

As well known to those of skill in the art, implementing a CRC having a certain "width" (K bits, for instance) may involve using a polynomial and a "seed" value to initialize the circuit.

A general discussion of the basic principles and criteria underlying implementing CRC can be found in Peterson, W. W. and Brown, D. T.: "Cyclic Codes for Error Detection," Proceedings of the IRE, January 1961, pp. 228-235.

FIGS. 1A and 1B are exemplary of (conventional) circuits configured to compute a K-bit CRC (namely comprising K bits) by using a K-bit seed starting from a string of N bits by implementing a serial solution S (FIG. 1A, with input bits $D_0, \ldots, D_{N-1}$ supplied serially to a circuit input In) or a parallel solution P (FIG. 1B, with a set of input bits collectively designated D supplied in parallel to the circuit input In).

Serial circuits (FIG. 1A, for instance) exhibit a smaller area footprint with the disadvantage of multiple clock cycles involved in computing the result.

Parallel or combinational circuits (FIG. 1B, for instance) exhibit the advantage of computing the result directly from an entire input data set D with disadvantages related to consumption of resources, lower speed and limited re-usability for variable data sizes (of the input data D).

FIG. 2A is exemplary of a serial circuit arrangement which may be used to compute a CRC from a string of input bits $D_0, \ldots, D_{N-1}$ supplied serially to a circuit input by using a linear-feedback shift register (briefly LFSR). The (conventional) solution illustrated in FIG. 2A can be regarded as somewhat exemplary of a "non-forward" architecture.

The diagram of FIG. 2A is exemplary of an arrangement implementing a CRC computation on the basis of a polynomial which can be expressed as:

$$1+x+x^2+x^3+x^5+x^8$$

The arrangement as exemplified in FIG. 2A comprises 8 registers (flip-flops, FF0 to FF7) in a cascaded arrangement with the registers FF0, FF1, FF2, FF3 and FF5 preceded by respective exclusive OR (EX-OR or XOR) gates XOR0, XOR1, XOR2, XOR3 and XOR5. The registers FF0, FF1, FF2, FF3 and FF5 are arranged in positions in the cascaded arrangement which correspond to the exponents of the elements of the CRC polynomial with $x^0=1$ with the exception of the highest order term in the polynomial, namely $x^8$.

The gate XOR0 receives the input (serial) data at one of its inputs and each one of the other XOR gates, namely XOR1, XOR2, XOR3 and XOR5 receives at one of their inputs the output from the preceding register in the cascaded arrangement (namely XOR1 from FF0, XOR2 from FF1, XOR3 from FF2 and XOR5 from FF4).

All of the XOR gates receive at their other inputs a feedback signal from the output of the last register in the cascaded arrangement (namely FF7).

In an arrangement as exemplified in FIG. 2A, configured to implement the CRC polynomial $1+x+x^2+x^3+x^5+x^8$ as discussed previously, the registers FF4, FF6 and FF7 (that is those registers that are not preceded by an XOR gate) receive their input from the output of the preceding register (namely FF4 from FF3, FF6 from FF5 and FF7 from FF6).

An arrangement as exemplified in FIG. 2A (for instance in connection with the possible locations of the XOR gates at positions dictated by the CRC polynomial as discussed previously) is otherwise conventional in the art, which makes it unnecessary to provide a more detailed description herein.

Operation of a serial circuit as exemplified in FIG. 2A to compute a CRC involves initializing the registers with the "seed" values, shifting the data in the LFSR followed by an amount of "zeros" equal to the width of the CRC.

Operation of a serial circuit as exemplified in FIG. 2A to compute a CRC involves initializing the registers with the "seed" values with data shifted (in a cyclical manner in the linear-feedback shift register) with an amount of "zeros" equal to the width of the CRC shifted in the LFSR.

Operation of an arrangement as exemplified in FIG. 2A involves shifting K zeros after the N data bits. Computing a K-bit wide CRC from an N-bit data set thus involves K+N clock cycles as produced by a clock generator (not visible in the figure).

Such an approach may be disadvantageous for various reasons.

In the first place, additional logic circuitry may be involved in handling such a task insofar as a circuit as exemplified in FIG. 2A alone is unable to provide a desired computation performance.

Also, an arrangement as exemplified in FIG. 2A makes the CRC computation process dependent on the data set size. Consequently, precise information as to the amount of data for which the checksum is computed has to be supplied to the logic circuitry responsible for shifting the zeros.

Also, operation of an arrangement as exemplified in FIG. 2A results in a gap between the time when the last data bit is shifted and time the CRC is actually computed.

In applications such as serial transmission protocols (Serial Peripheral Interface or SPI, for instance) where the checksum is sent after the data, an arrangement as exemplified in FIG. 2A militates against computing the CRC as the payload is transmitted.

The ability of removing such a constraint may facilitate flexibility and re-usability of the CRC circuit.

FIG. 2B is exemplary of an arrangement derived from the arrangement of FIG. 2A wherein, under the assumption of a CRC seed equal to zero, the possibility is provided of computing the CRC in N clock cycles.

In FIG. 2B, parts or elements like parts or elements already discussed in connection with FIG. 2A are indicated with like reference symbols: a corresponding detailed description of the arrangement of FIG. 2B will not be repeated for the sake of brevity.

Essentially (under the assumption that the arrangement of FIG. 2B shares with the arrangement of FIG. 2A the same CRC polynomial, namely $1+x+x^2+x^3+x^5+x^8$) in an arrangement as exemplified in FIG. 2B the input data $D_0, \ldots, D_{N-1}$ are (also) fed to a (third) input to the XOR gates XOR1, XOR2, XOR3 and XOR5.

It is noted that a "null" seed (with a CRC seed equal to zero) may represent a limitation insofar as i) only certain CRC codes may be compatible with such a specification, and ii) certain standards specify multiple seed values.

Additionally, it is observed that, even if per se admissible, a null seed may be less advantageous than a non-null seed. In fact, if the circuit is initialized with a zero seed value, the CRC of a null input dataset will be similarly null, which militates against detecting "stuck-at zero" faults.

The diagram of FIG. 3A is exemplary of an arrangement implementing a CRC computation (again) by resorting to a parallel (combinational) approach on the basis of a polynomial which can be expressed as:

$$1+x+x^2+x^3+x^5+x^8$$

by resorting to a parallel (combinational) approach.

The arrangement as exemplified in FIG. 3A comprises two sets of eight "building blocks" BB0 to BB7 and BB0' to BB7' in two cascaded arrangements, wherein:
  in the first arrangement (BB0 to BB7), BB0 receives a K-bit seed as input and each one of BB1 to BB7 receives as input IN the output OUT from the previous building block in the cascaded arrangement with the data bits D0 to D7 (data D in parallel format) applied as respective inputs to BB0 to BB7; and
  in the second arrangement (BB0' to BB7'), BB0' receives as input the K-bit output from the last building block of the first arrangement (BB0 to BB7) and each one of BB1' to BB7' receives as input IN the output OUT from the previous building block with the respective (data) inputs all set to zero ("0").

As a result, the number of building blocks increases with data size.

Figure 3B:
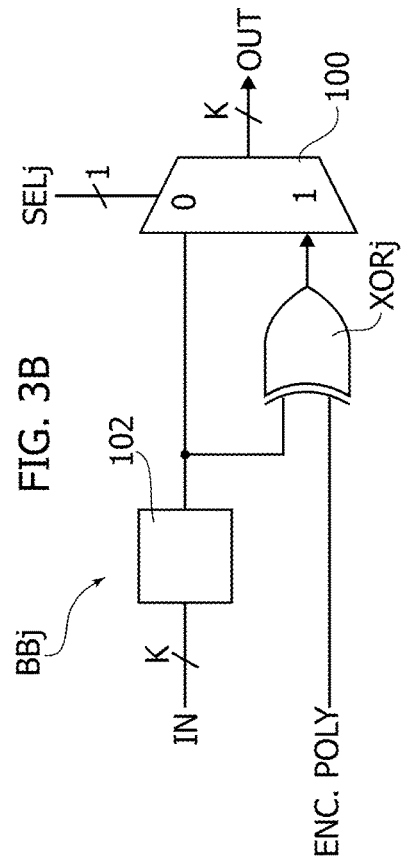
FIG. 3B is exemplary of a possible building block in a circuit as exemplified in FIG. 3A.

Each one of the building blocks BBj and BBj' with $j=0, \ldots, 7$ exemplified in FIG. 3A may be configured as exemplified in FIG. 3B, namely as including a multiplexer circuit 100 having two inputs (marked "0" and "1" in FIG. 3B) configured to receive:
  a 1-bit shifted replica of the (k-bit) input IN from a shift circuit 102, and
  the output from an exclusive-OR gate XORj, respectively.

The exclusive-OR gate XORj in turn receives:
  as a first input, the 1-bit shifted replica of the (k-bit) input IN from the shift circuit 102, and
  as a second input, an encoded version of the CRC polynomial that is a string of bits where the "1s" in the string correspond to the exponents of the elements of the CRC polynomial, with $x^0=1$ (that is, are arranged in positions in the cascaded arrangement which correspond to the exponents of the elements of the CRC polynomial with $x^0=1$ with the exception of the highest order term in the polynomial, namely $x^8$): for instance 11110100 for $1+x+x^2+x^3+x^5+x^8$, where the "0s" in the string of bits of encoded version of the CRC polynomial correspond to $x^4$, $x^6$, $x^7$, so that the second input of the exclusive-OR gate XORj will be "0" for XORj with j=4, 6 and 7.

As exemplified in FIG. 3A, the multiplexer 100 may be controlled (in order to transfer to the output OUT either one of the inputs marked "0" and "1") as a function of a 1-bit signal SELj corresponding to the data D, namely Selj=Dj with j=0, . . . , 7.

Again, an arrangement as exemplified in FIGS. 3A and 3B is conventional in the art, which makes it unnecessary to provide a more detailed description herein.

It is otherwise observed that setting to "0" the 1-bit signal SELj corresponding to the data D in the lower portion of FIG. 3A (that is Selj=0 with j=0, . . . , 7 for all the blocks BB0' to BB7') amounts to setting the multiplexer 100 therein to a fixed position so that such a multiplexer, while illustrated for ease of explanation, can be actually dispensed with.

As discussed previously, parallel or combinational circuits (FIGS. 3A and 3B, for instance) may exhibit disadvantages related to consumption of resources, lower speed and limited re-usability for variable data sizes (of the input data D).

Figure 4:
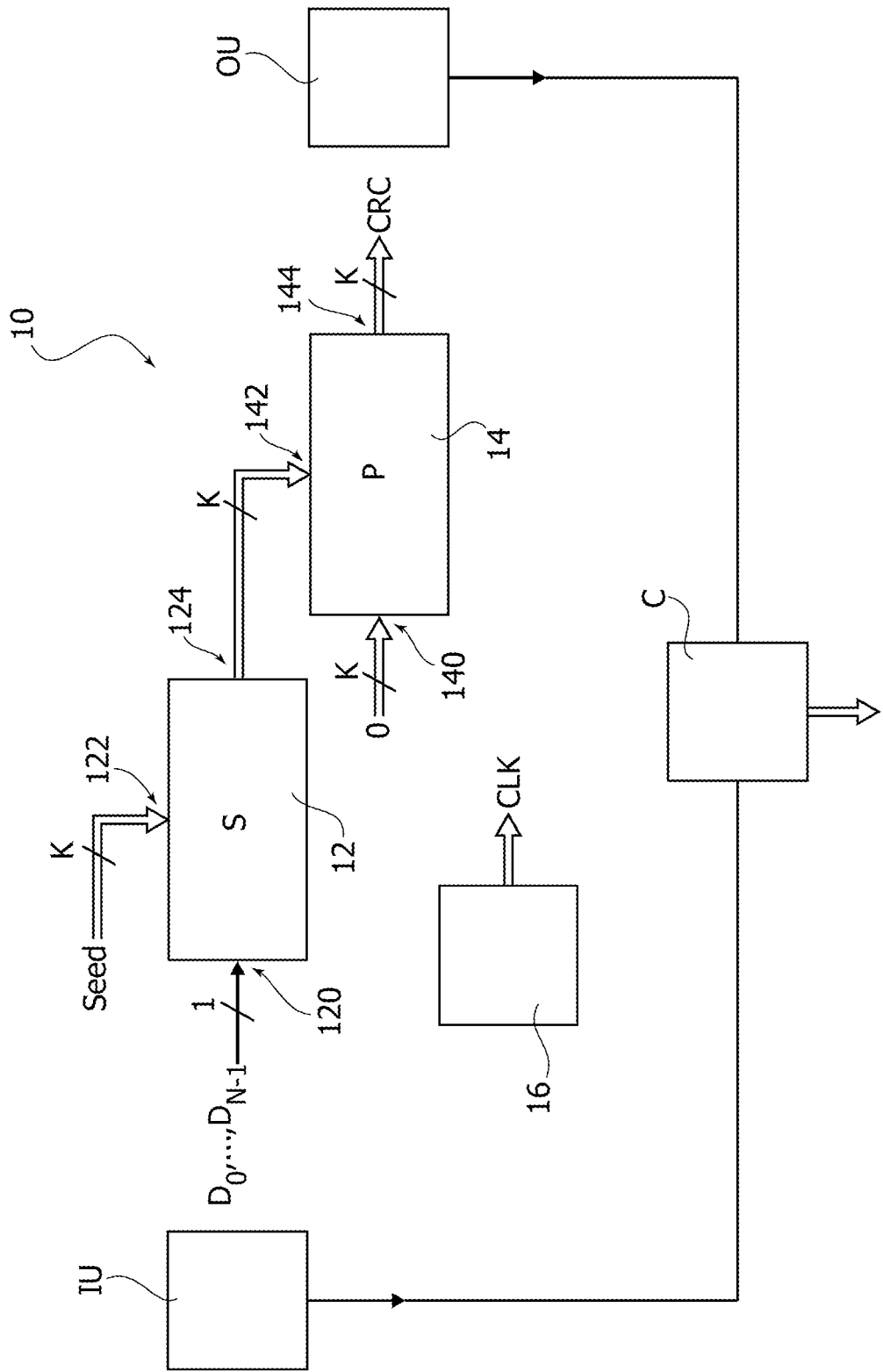
FIG. 4 is a functional block diagram of a system including a circuit implementing a computation of a CRC according to example embodiments.

One or more embodiments of a system 400 may rely on a hybrid circuit architecture as exemplified in FIG. 4.

Such a hybrid circuit (designated 10 as a whole) combines:
    a serial CRC circuit 12 (essentially as exemplified in FIG. 1A and discussed more in detail in connection with FIG. 2A), and
    a parallel/combinational CRC circuit 14 (essentially as exemplified in FIG. 1B and discussed more in detail in connection with FIGS. 3A and 3B).

In a hybrid arrangement as exemplified in FIG. 4 input data $D_0$, . . . , $D_{N-1}$ (as provided by a source or input circuit IU, which may typically have one or more processors or processor cores P and one or more memories M) can be provided serially to an input node 120 of the serial circuit 12 which also receives a K-bit seed provided (in any manner known to those of skill in the art) to a seed input 122.

In an arrangement as exemplified in FIG. 4, serial CRC processing in the circuit 12 will result in an "intermediate" (K-bit) signal provided at an output node 124 which can be supplied as a seed to a seed input node 142 of the parallel CRC circuit 14 which is configured to receive null data ("0s") at its K-bit input node 140 to produce at an output node 144 a final desired (K-bit) CRC to be supplied to a user or output circuit OU.

In one or more embodiments a combination of the circuit 10 plus the source or input circuit IU and the user or output circuit OU may be included in any device configured to implement a checksum procedure, to verify data integrity, for instance, in data transmission and storage, for instance.

For instance, the source or input unit IU may transmit over a "channel" C data whose integrity is checked by using the CRC made available at the user or output circuit OU. For example, a data packet including input data and a CRC appended thereto may be transmitted in the channel, stored in a memory, etc.

For instance, one such arrangement may be used to verify the integrity of data as stored in a memory upon reading these data from the memory, for instance.

In one or more embodiments as exemplified in FIG. 4, the serial stage 12 may comprise a serial (non-forward) CRC circuit as exemplified in FIG. 2A and the parallel stage 14 may comprise a combinational CRC circuit as exemplified in FIGS. 3A and 3B operating on the basis of the same polynomial with:
    the output from the serial stage 12 at node 124 supplied as a seed to the parallel/combinational stage 14 at the seed input node 142, and
    the input to the combinational stage 14 at the input 140 set to zero (K zeros).

Using the output (node 124) from the serial stage 12 as a seed for the combinational stage 14 (node 142) causes the combinational stage 14 to compute the result of the shift of K zeros starting from the result of the serial stage.

Figure 5:
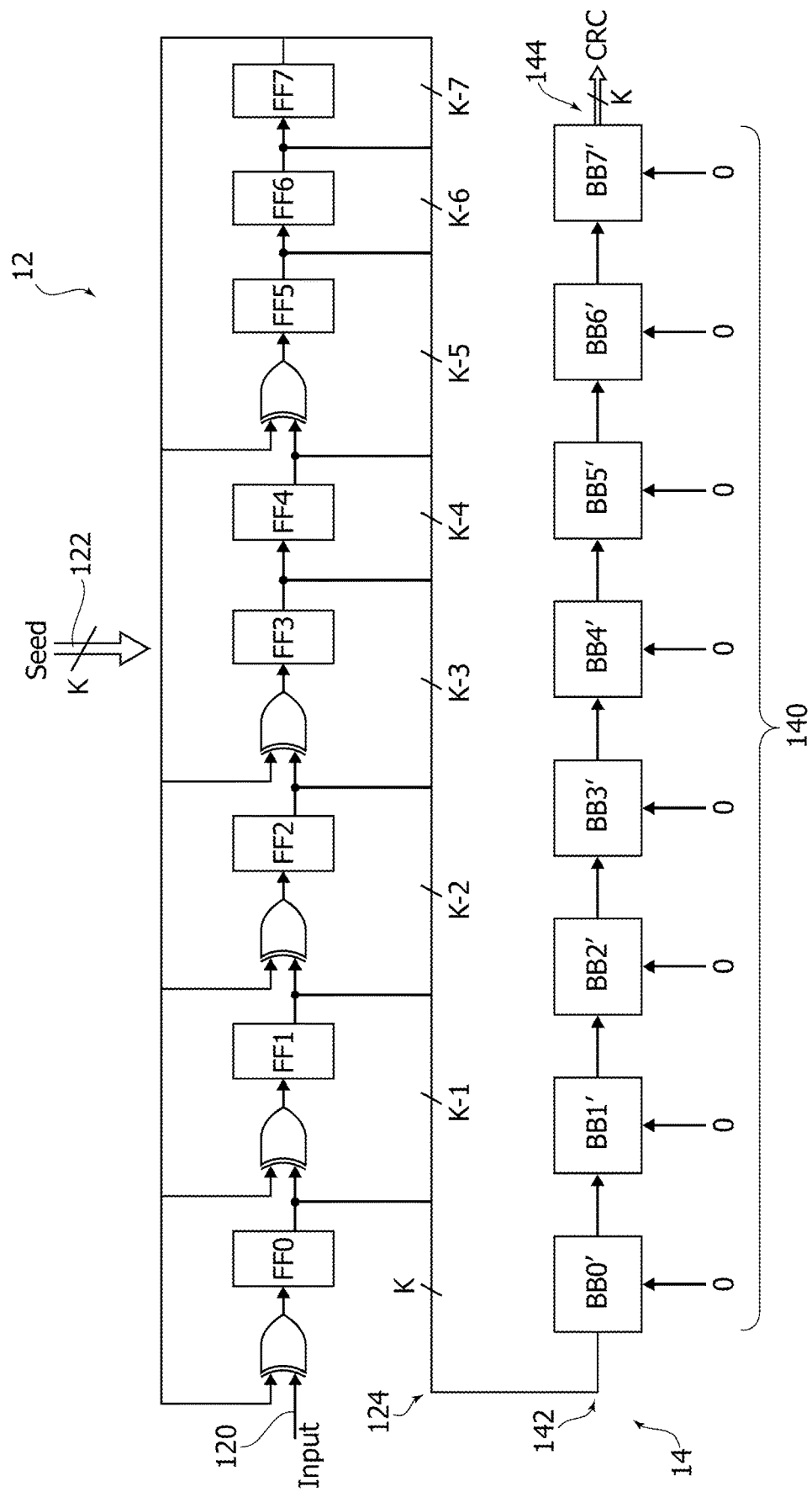
FIG. 5 is a more detailed diagram of a possible implementation a circuit diagram as exemplified in FIG. 4.

FIG. 5 is a more detailed representation of a possible implementation of a circuit corresponding to the arrangement generally exemplified in FIG. 4.

The representation of FIG. 5 is exemplary of the possibility of optimizing such an implementation beyond the mere assembly of an implementation as exemplified in FIG. 3A ("parallel" or "combinational" CRC processing) with an implementation as exemplified in FIG. 2A ("serial" CRC processing).

In FIG. 5, parts or elements like parts or elements already discussed in connection with FIG. 4 (and the other figures as well) are indicated with like reference symbols: a corresponding detailed description of the arrangement of FIG. 5 will not be repeated for the sake of brevity.

Briefly, FIG. 5 is a more detailed representation of a circuit exemplified in FIG. 4 implemented by using, for the first circuit stage 12—configured to implement serial CRC processing—an arrangement as exemplified in FIG. 2A receiving input data bits $D_0$, . . . , $D_{N-1}$ (input 120) and the CRC seed (input 122) and produce at the output port 124 "intermediate" CRC processed data as a function of the input data bits and the CRC seed.

As exemplified in FIG. 5, these "intermediate" CRC processed data may be supplied as a CRC seed to seed input 142 of the second circuit stage 14—configured to implement parallel or combinational CRC processing—just like the output from the "upper" arrangement in FIG. 3A (BB0 to BB7) is applied to the second arrangement (BB0' to BB7') with the respective (data) inputs all set to zero ("0"—null input data bits) at the input 140.

As exemplified herein, the second circuit stage 14 is configured to implement parallel (combinational) CRC processing of the null input data bits D="0" and the intermediate data received (from the line 124 in the first circuit stage 12) at the respective seed input port 142. The resulting CRC processed data is produced at the respective output port 144 as a function of the null input data bits and the intermediate CRC processed data.

Here again, it is observed that setting to "0" the 1-bit signal SELj corresponding to the data D in the lower portion of FIG. 5 (that is Selj=0 with j=0, . . . , 7 for all the blocks BB0' to BB7') amounts to setting the multiplexer 100 (see the representation in FIG. 3B) to a fixed position so that such a multiplexer can be actually dispensed with in all the blocks BB0' to BB7').

In that way, the output node OUT in each block BB0' to BB7' will receive directly the output from the X-OR gate XORj having:
    one input coupled to the input node IN via the 1-bit shift 102, and
    the other input configured to receive the signal ENC POLY, that is one of the bits in a string providing an encoded version of the CRC polynomial, namely a string of bits where the "1s" in the string correspond to the exponents of the elements of the CRC polynomial, with $x^0=1$ by being arranged in positions in the string which correspond to the exponents of the elements of the CRC polynomial with $x^0=1$ with the exception of the highest order term in the polynomial, namely $x^8$): for instance 11110100 for $1+x+x^2+x^3+x^5+x^8$.

In one or more embodiments as exemplified in FIGS. 4 and 5, the CRC of a N bit dataset ($D_0, \ldots, D_{N-1}$) can be computed in a N clock cycles (from a clock generator CLK) without notable restrictions on the selection of the seed applied to the seed input 122 of the serial stage 12. One or more embodiments as exemplified in FIG. 4 may thus combine the advantages of the forward and non-forward architectures as exemplified in FIGS. 2A and 2B.

One or more embodiments as exemplified in FIGS. 4 and 5 facilitate computing the CRC of an N-bit dataset in N clock cycles. When the last bit is shifted at the input 120 the CRC is ready with the output (at 144 in FIG. 4) containing a valid CRC for the data shifted up to that point.

Consequently, in those applications such as serial transmission protocols where the checksum is sent (over a channel such as C in FIG. 4, for instance) after the data, an arrangement as exemplified in FIGS. 4 and 5 facilitates computing the CRC as the payload is transmitted.

One or more embodiments as exemplified in FIGS. 4 and 5 involve a reduced amount of external logic for integration.

Also one or more embodiments as exemplified in FIGS. 4 and 5 facilitate use of virtually any seed with virtually any type of CRC adapted to be implemented.

One or more embodiments may achieve those advantages with a tolerable increase of area/delay overhead primarily related to the combinational stage 14. It is otherwise observed that such overhead is a proportional to the CRC width (K, for instance) and not to the dataset size (N, for instance) as in the case of fully combinational architectures, thus being negligible for small CRC widths.

A circuit (for instance, 10) for computing a cyclical redundancy check (code), currently referred to as CRC, as exemplified herein may comprise:
 a first circuit stage (for instance, 12, S) having a serial data input node (for instance, 120) configured to receive input data bits (for instance, $D_0, \ldots, D_{N-1}$), a seed input port (for instance, 122) configured to receive a CRC seed and an output port (for instance, 124), the first circuit stage configured to implement serial CRC processing of said input data bits and said CRC seed and produce intermediate CRC processed data at said output port as a function of said input data bits and said CRC seed, and
 a second circuit stage (for instance, 14, P) having a respective seed input port (for instance, 142) coupled to the output port of the first circuit stage to receive therefrom said intermediate CRC processed data and a respective output port (for instance, 144), the second circuit stage configured to implement parallel CRC processing of null input data bits and said intermediate CRC processed data received at said respective seed input port and produce resulting CRC processed data at said respective output port as a function of said null input data bits and said intermediate CRC processed data.

In a circuit as exemplified herein, the first circuit stage and the second circuit stage may be configured to implement serial CRC processing and parallel CRC processing, respectively, as a function of a same CRC polynomial.

In a circuit as exemplified herein, the first circuit stage may comprise a linear-feedback shift register, LFSR.

In a circuit as exemplified herein (see for instance FIG. 5 and FIG. 3B, where the multiplexer 100 may be dispensed with if SELj=0, that is with null input data):
 the second circuit stage (14, P) may comprise a cascaded arrangement of combinational blocks (for instance BB0', ..., BB7'), the combinational blocks having an input node (for instance, IN) and an output node (for instance, OUT) with an exclusive OR gate (for instance, XORj) having a respective output node coupled to the output node, a first respective input coupled to the input node via a 1-bit shift block (for instance, 102) and a second respective input (for instance, ENC POLY) configured to receive one of the bits in a string providing an encoded version of the CRC polynomial,
 the input node of the first block in the cascaded arrangement of combinational blocks may be coupled to the output port of the first circuit stage to receive therefrom said intermediate CRC processed data,
 the blocks in the cascaded arrangement of combinational blocks other than said first block may have their input node coupled to the output node of the preceding block in the cascaded arrangement of combinational blocks,
 the output node of the last block in the cascaded arrangement of combinational blocks may provide said respective output port to produce resulting CRC processed data as a function of said null input data bits and said intermediate CRC processed data.

A device as exemplified herein (for instance, IU, 10, OU) may comprise:
 a source circuit (for instance, IU) of said input data bits,
 a circuit as exemplified herein having said serial data input node of the first circuit stage coupled to said source circuit to receive said input data bits therefrom, and
 a user circuit (for instance, OU) coupled to said respective output port of the second circuit stage to receive said resulting CRC processed data therefrom.

A method of transferring data bits over a transfer channel (for instance, C) may comprise supplying said data bits to the serial data input node of the first circuit stage in a circuit (for instance, 10) as exemplified herein and produce resulting CRC processed data at said respective output port during transfer said input data bits over said transfer channel.

A method as exemplified herein may comprise transferring said resulting CRC processed data over said transfer channel following transfer said input data bits (as payload, for instance) over said transfer channel.

Without prejudice to the underlying principles, the details and embodiments may vary, even significantly, with respect to what has been described by way of example only, without departing from the scope of protection.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
serial cyclic redundancy check (CRC) processing circuitry, which, in operation:
receives input data; and
generates a set of intermediate CRC bits using a first set of seed bits and the received input data; and
parallel CRC processing circuitry coupled to the serial CRC processing circuitry, wherein the parallel CRC processing circuitry, in operation, generates a set of output CRC bits corresponding to the received input data using:
the set of intermediate CRC bits as a set of parallel seed bits to the parallel CRC processing circuitry; and
null bits as a set of input bits to the parallel CRC processing circuitry.

2. The device of claim 1, wherein the serial CRC processing circuitry and the parallel CRC processing circuitry, in operation, use a same CRC polynomial.

3. The device of claim 1, wherein the serial CRC processing circuitry comprises a linear-feedback shift register, LFSR.

4. The device of claim 1, wherein the parallel CRC processing circuitry comprises a combinational CRC circuit.

5. The device of claim 1, wherein the parallel CRC processing circuitry comprises a cascaded arrangement of combinational circuits, each of the combinational circuits including:
a one-bit shift circuit having an input coupled to a data input node of the combinational circuit; and
an exclusive OR (XOR) gate having a first input coupled to an output of the one-bit shift circuit, a second input which, in operation, receives a bit of a bit string encoding a CRC polynomial, and an output coupled to an output node of the combination circuit, wherein,
the input node of a first combinational circuit in the cascaded arrangement of combinational circuits is coupled to the serial CRC processing circuitry, and, in operation receives the set of intermediate CRC bits;
the data input nodes of the combinational circuits in the cascaded arrangement of combinational circuits other than the first combinational circuit are coupled to the output node of a preceding combinational circuit in the cascaded arrangement of combinational circuits; and
the output node of a last combinational circuit in the cascaded arrangement of combinational circuits, in operation, outputs the set of output CRC bits corresponding to the input data.

6. The device of claim 5, wherein the serial CRC processing circuitry comprises a linear-feedback shift register, LFSR.

7. The device of claim 1 wherein the first set of seed bits has a size of K bits, the set of intermediate CRC bits has a size of K bits, and the set of output CRC bits has a size of K bits, where K is a positive integer greater than 1.

8. The device of claim 7 wherein the input data has a size greater than K bits.

9. A system, comprising:
data processing circuitry, which, in operation, generates input data;
cyclic redundancy check (CRC) generating circuitry coupled to the data processing circuitry, the CRC generating circuitry including:
serial CRC circuitry, which, in operation, generates a set of intermediate CRC bits using a first set of seed bits and input data generated by the data processing circuitry; and
parallel CRC circuitry coupled to the serial CRC circuitry, wherein the parallel CRC circuitry, in operation, generates a set of output CRC bits corresponding to the generated input data using:
the set of intermediate CRC bits as a set of parallel seed bits to the parallel CRC processing circuitry; and
null bits as a set of input bits to the parallel CRC processing circuitry.

10. The system of claim 9, comprising output processing circuitry, which, in operation, receives the set of output CRC bits from the CRC generating circuitry.

11. The system of claim 10 wherein the output processing circuitry receives the input data and combines the input data with the set of output CRC bits in a data packet.

12. The system of claim 11, comprising a memory, wherein the output processing circuitry controls storage of the data packet in the memory.

13. The system of claim 11, comprising a transmitter, wherein the output processing circuitry controls transmission of the data packet by the transmitter in a data channel.

14. The system of claim 9, wherein the serial CRC circuitry and the parallel CRC circuitry, in operation, use a same CRC polynomial.

15. The system of claim 9, wherein the parallel CRC circuitry comprises a cascaded arrangement of combinational circuits, each of the combinational circuits including:
a one-bit shift circuit having an input coupled to a data input node of the combinational circuit; and
an exclusive OR (XOR) gate having a first input coupled to an output of the one-bit shift circuit, a second input which, in operation, receives a bit of a bit string encoding a CRC polynomial, and an output coupled to an output node of the combination circuit, wherein,
the input node of a first combinational circuit in the cascaded arrangement of combinational circuits is coupled to the serial CRC circuitry, and, in operation receives the set of intermediate CRC bits;
the data input nodes of the combinational circuits in the cascaded arrangement of combinational circuits other than the first combinational circuit are coupled to the output node of a preceding combinational circuit in the cascaded arrangement of combinational circuits; and
the output node of a last combinational circuit in the cascaded arrangement of combinational circuits, in operation, outputs the set of output CRC bits corresponding to the input data.

16. The system of claim 15, wherein the serial CRC circuitry comprises a linear-feedback shift register, LFSR.

17. A method, comprising:
generating, using serial cyclic redundancy check (CRC) circuitry, a set of intermediate CRC bits based on a first set of seed bits and input data; and
generating, using parallel CRC circuitry, a set of output CRC bits corresponding to the input data using:
the set of intermediate CRC bits as a set of parallel seed bits to the parallel CRC circuitry; and
null bits as a set of input bits to the parallel CRC processing circuitry.

18. The method of claim 17, comprising generating the input data.

19. The method of claim 18, comprising combining the input data with the set of output CRC bits in a data packet.

20. The method of claim 19, comprising storing the data packet.

21. The method of claim 19, comprising transmitting the data packet over a data channel.

\* \* \* \* \*